(12) United States Patent
Martin

(10) Patent No.: US 6,531,264 B1
(45) Date of Patent: Mar. 11, 2003

(54) INTEGRATED CIRCUIT MANUFACTURE

(75) Inventor: Brian Martin, Plymouth (GB)

(73) Assignee: Mitel Semiconductor Limited, Swindon (GB)

( * ) Notice: Subject to any disclaimer, the term of this patent is extended or adjusted under 35 U.S.C. 154(b) by 28 days.

(21) Appl. No.: 09/616,342

(22) Filed: Jul. 14, 2000

(30) Foreign Application Priority Data

Jul. 16, 1999 (GB) .............................................. 9916730

(51) Int. Cl.$^7$ ................................................ G03F 7/26

(52) U.S. Cl. ......................... 430/311; 430/327; 430/30

(58) Field of Search ......................... 430/30, 311, 396, 430/327

(56) References Cited

U.S. PATENT DOCUMENTS

| | | | |
|---|---|---|---|
| 4,738,910 A | 4/1988 | Ito et al. | |
| 5,556,726 A | 9/1996 | Yuan | |
| 5,916,717 A | 6/1999 | Yang et al. | |

OTHER PUBLICATIONS

DeForest, *"Photoresist materials and Processes"*, Published 1975, McGraw Hill, pp. 116–120, 248.

*Primary Examiner*—Kathleen Duda
(74) *Attorney, Agent, or Firm*—Kirschstein, et al.

(57) ABSTRACT

A method of manufacturing integrated circuits is performed by coating a substrate with resist, exposing the resist to light through a pattern in a mask so as to define slots in the resist corresponding to the pattern in the mask, chemically developing the resist after exposure to light, and choosing the thickness of the resist so as to achieve the desired profile of the slots defined in the resist.

9 Claims, 2 Drawing Sheets

INTEGRATED CIRCUIT MANUFACTURE

BACKGROUND OF THE INVENTION

The present invention relates to the manufacture of integrated circuits.

Lithography is a means by which the surface geometry of integrated circuit components is defined photographically. The surface of a substrate is coated with a photosensitive layer of photoresist. When exposed to light through a master pattern on a photographic plate, or mask, the photoresist undergoes chemical changes. The exposed layer can then be removed using a chemical developer, causing the pattern in the mask to appear on the substrate.

During the set-up of photoresist processes, two parameters are commonly taken into account. The first of these is $E_S$, the so-called "exposure to size". This is the exposure, or total energy of light, required to define a feature at its target size. In other words, for light of any given intensity, $E_S$ is proportional to the length of time required to expose enough resist to light that when the resist is developed the mask pattern is exactly reproduced at the substrate.

The second parameter is $E_O$, which is the exposure required to just clear an "open field" area, i.e., an area without any critical patterns and thus one which would not be affected by diminishing aerial image intensity as pattern size approaches the imaging wavelength. In other words, $E_O$ is the exposure required so that the chemical change in the resist only just penetrates down to the substrate when light is shone on a large area.

A commonly used metric in the set-up of photoresist processes in integrated circuit manufacture is the ratio $E_S/E_O$, and a safe margin typically quoted for $E_S/E_O$ is 1.4. The drawback with this metric is that when the developer is working with very small features, particularly holes or gaps, the exposure $E_O$ ceases to be a useful parameter.

SUMMARY OF THE INVENTION

The present invention recognizes the importance of a different metric in the definition of patterns, particularly holes or gaps. This metric is $E_S/E_C$, where $E_C$ is the exposure needed to just clear a critical feature at high resolution, in other words, the exposure required so that the chemical change in the resist only just penetrates down to the substrate when light is shone on the area of a small feature only. Typically, for contemporary lithography at 365 nm exposure in integrated circuit manufacture, $E_O$ will diverge from $E_C$ at pattern sizes below 0.5 μm.

According to the invention there is provided a method for manufacturing integrated circuits, comprising the steps of coating a substrate with resist, exposing the resist to light through a pattern in a mask so as to define apertures in the resist corresponding to the pattern in the mask, chemically developing the resist after exposure to light, and choosing the thickness of the resist so as to achieve the desired profile of the apertures defined in the resist.

Preferably, the thickness of the resist is chosen so as to maximize the ratio between the exposure needed to define a feature at its target size ($E_S$) and the exposure needed to just clear said feature ($E_C$).

At least one of the features in the pattern in the mask may have a width of 0.5 μm or less.

The light may have a wavelength of the order of 365 nm.

The resist is preferably photoactive.

The substrate is preferably transparent, and may be formed from silicon nitride or an oxide of silicon.

In practice most lithography is performed on transparent substrates, and if this is the case, then the "swing curve" of the substrate and the resist layer are important. Swing curves arise from interference effects from reflections at boundaries, and result in the profile of the slot etched in the resist varying sinusoidally with resist thickness or substrate thickness. Preferably, therefore, the thickness of the resist is chosen such that the lithography process operating point is insensitive to substrate thickness changes. This may be achieved by the thickness of the resist being chosen near the turning point of the substrate swing curve which corresponds to minimum reflectivity during the development process.

The technique is particularly applicable to those critical features which form "gaps" or "holes" as opposed to "lines" in patterns. Several critical layers processed in advanced processes are of this type and include active area, contacts and holes in complementary metal oxide semiconductor (CMOS) processes and emitters in bipolar processes.

BRIEF DESCRIPTION OF THE DRAWINGS

Some preferred embodiments of the invention will now be described by way of example only and with reference to the accompanying drawings, in which.

DETAILED DESCRIPTION OF THE PREFERRED EMBODIMENTS

Figure 1:
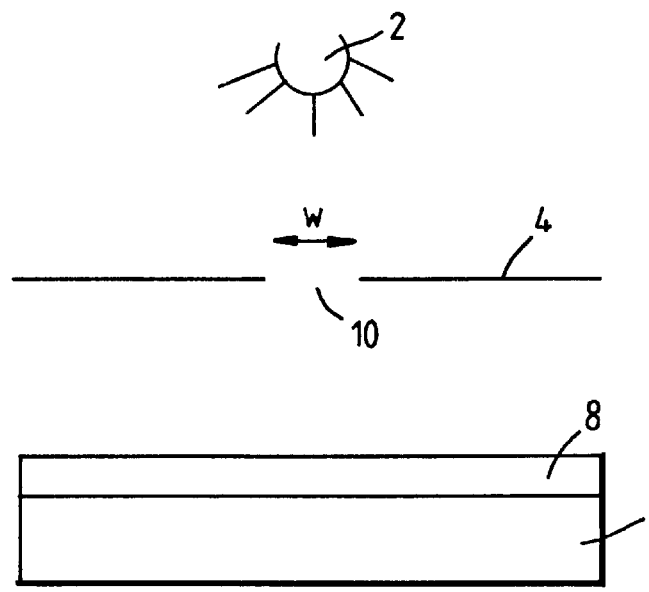
FIG. 1 shows schematically the apparatus used for photographically defining the surface geometry of an integrated circuit.

FIG. 1 shows schematically the method for performing lithography on a semiconductor substrate. A monochromatic light source 2 is directed towards a mask 4, behind which is situated a substrate 6 coated with a photoactive resist 8. A gap 10 of width w is provided in the mask 4 which allows light to reach the resist 8 on the substrate 6. In practice, a whole pattern (not shown) is formed in the mask 4, but this is represented more simply by the single gap 10. The substrate 6 may typically be of silicon, or silicon oxide, or silicon nitride.

In order to etch the pattern in the mask 4 onto the substrate 6, the light is turned on for a predetermined period of time, which causes chemical changes in the resist 8. The aim of the process is that the location of these chemical changes should exactly mirror the pattern provided by gaps 10 in the mask 4. After the resist 8 has been exposed to the light 2 the exposed layer is removed using a chemical developer. Hereinafter the combination of exposure to light with developing will be referred to as "removal" of resist.

Figure 2A:
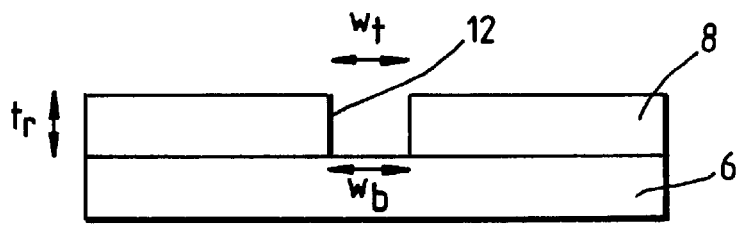
FIGS. 2A and 2B show the profiles of a resist on a substrate after exposure to light energy $E_S$ and after exposure to light energy $E_C$, respectively.

Referring now to FIG. 2, the problem with this method is that the resist 8 has a finite thickness $t_r$, typically of the order of 1 μm, and it is difficult to judge the correct period of exposure to light 2 to remove exactly the right amount of resist 8. FIG. 2A shows the ideal profile of a slot 12 formed by removal of resist 8 from a substrate 6. The width $w_b$ at the bottom of the slot 12 is equal to the width $w_t$ at the top of the slot 12, and this in turn is equal to the width w of the gap 10 in the mask 4 (see FIG. 1). The exposure to light required to ensure that $w_b \geq w$ is known as the exposure to size ($E_S$). This is the exposure needed to define a feature at its target size.

Figure 2B:
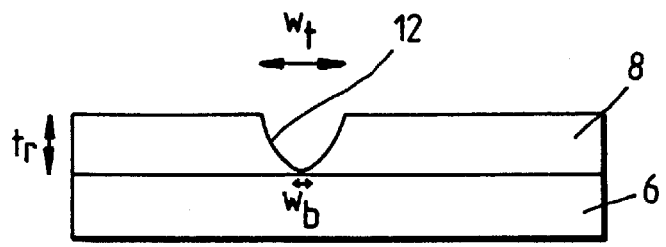

FIG. 2B shows the profile of the same slot 12 at an earlier stage of the process. Here the exposure has been sufficient to clear the resist 8 just enough to reach the substrate 6. It is to be noted that while wt may have reached w, $w_b$ is only just non-zero. This exposure is termed the exposure to clear ($E_C$), and is the exposure needed to just clear a critical feature at high resolution. Clearly if the resist 8 has been exposed to only this amount of light, the pattern represented by the gap 10 will not be properly etched onto the substrate, as most of the bottom of the slot is still covered by resist.

The exposure to just clear an "open field" area, i.e., an area without any critical patterns and thus one which would not be affected by diminishing aerial image intensity as the pattern size approaches the imaging wavelength, is expressed as $E_O$.

The metric commonly used in the set-up of photoresist processes in integrated circuit (IC) manufacturing is the ratio $E_S/E_O$. The margin for error in the determination of the exposure to be used depends on the difference between the exposure required to exactly define a feature at the interface between the resist 8 and the substrate 6, and the exposure needed to just clear to the interface. Ideally, this difference should be as large as possible so that a small variation in exposure will not adversely affect the definition of the features. A safe margin typically quoted for $E_S/E_O$ is 1.4.

It has been found that a much more important metric in the definition of holes or gaps, where the developer has to remove exposed resist in a small area, i.e., an area of general dimension<0.5 μm, is $E_S/E_C$. Referring to FIG. 2, if $E_S/E_C$ is maximized, then the exposure required to produce slot 12 shown in FIG. 2A is considerably greater than the energy required to produce slot 12 shown in FIG. 2B. When the ratio $E_S/E_C$ is high, there is a bigger margin for error than when $E_S/E_C$ is close to 1. If the bottom of the slot is not completely cleared across the full width w, the remaining resist is referred to as "resist scumming".

When photoresist patterns are defined on reflective substrates such as silicon, polysilicon or aluminum, some of the properties of the slot depend on the resist thickness, because of interference effects in monochromatic light. In particular, the profile of the edge of the slot 12 can vary cyclically with resist thickness. These functions are commonly referred to as "swing curves". The standing waves set up in the resist and substrate result in a variation of energy density across the thickness of the resist, and this in turn affects the rate at which resist is removed. The chemical changes which the light produces in the resist do not significantly affect its optical properties, so the phase of the light across the resist remains unchanged throughout the process.

Figure 3:
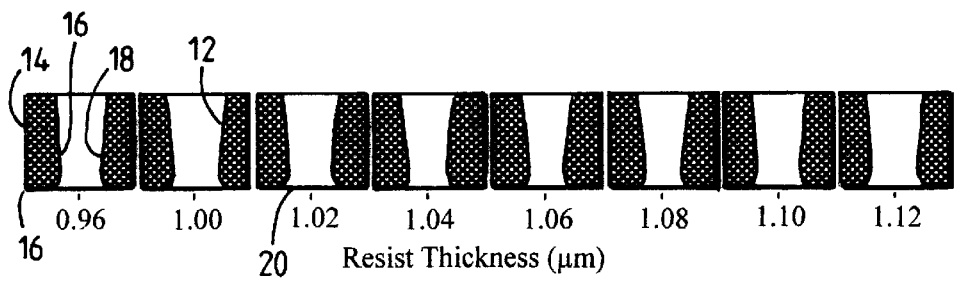
FIG. 3 shows eight profiles of resist on silicon for different resist thicknesses.

FIG. 3 shows the simulated pictorial representation of a "swing curve" for resist 14 on silicon. FIG. 3 shows the profile 16, 18 of a slot 12 defined through the thickness of the resist 14, at eight different resist thicknesses varying from 0.98 μm to 1.12 μm. Shading in FIG. 3 can be disregarded. It can be seen that the slot width is greatest for a resist thickness of 0.96 μm, then diminishes as the resist thickness increases, so that the minimum slot width occurs at a resist thickness of 1.06 μm; as the resist thickness continues to increase, the slot width increases again up to a second maximum for a resist thickness of 1.12. For all eight profiles shown in FIG. 3, the resist profile 16, 18 exhibits a small undercut 20 at the resist/silicon interface 24. For the case of resist on silicon, the ratio $E_S/E_C$ is substantially unaffected by resist thickness changes and varies between 1.095 and 1.105 through a "swing curve" cycle.

This low value (~1.1) of $E_S/E_C$ does not give an acceptably safe margin against resist scumming compared to the open field value of 1.4, but there is very little that can be done to change it. However, in practice, photoresist is normally defined on a transparent substrate, such as silicon nitride (nitride) or an oxide of silicon. This happens at several critical levels of complementary metal oxide semiconductor (CMOS) processes, and in these cases interference effects caused by the reflections at various interfaces are more complex. Both the photoresist and the nitride films now exhibit "swing curves" as their thickness varies.

Figure 4:
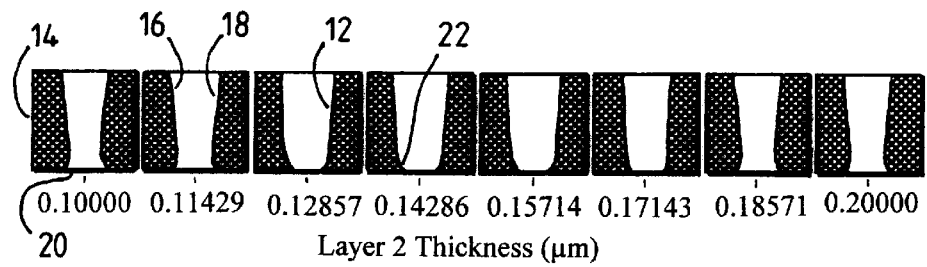
FIG. 4 shows eight profiles of resist on nitride for different nitride thicknesses.

FIG. 4 shows the simulated pictorial representation of a "swing curve" for resist 14 on silicon nitride. FIG. 4 shows the profile 16, 18 of a slot 12 defined through the thickness of the resist 14, for eight different nitride thicknesses varying from 0.1 μm to 0.2 μm. This time the resist thickness has been kept constant. Shading in FIG. 4 can again be disregarded. FIG. 4 shows that for a constant resist thickness the nitride "swing curve" results in the resist profile 16, 18 either being undercut 20 or exhibiting a "foot" 22. The "foot" 22 on the resist profile 16, 18 is not desirable as it may be transferred into the etched feature and adversely affect field oxide growth.

Figure 5:
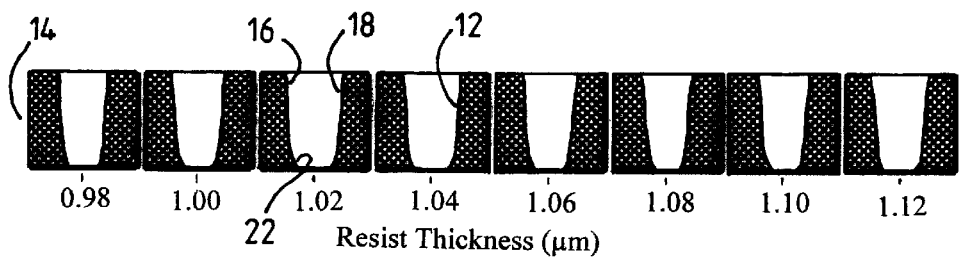
FIG. 5 shows eight profiles of resist on nitride for different resist thicknesses.

FIG. 5 shows a "swing curve" for resist 14 on silicon nitride. FIG. 5 shows the profile 16, 18 of a slot 12 defined through the thickness of the resist 14, for eight different resist thicknesses varying from 0.1 μm to 0.2 μm, for a constant nitride thickness. Shading in FIG. 5 can again be disregarded. Although the width of the slot 12 varies with resist 14 thickness, the profile 16, 18 at the edge of the slot 12 does not. In other words, in FIG. 5 all of the profiles 16, 18 exhibit a "foot" 22.

Figure 6:
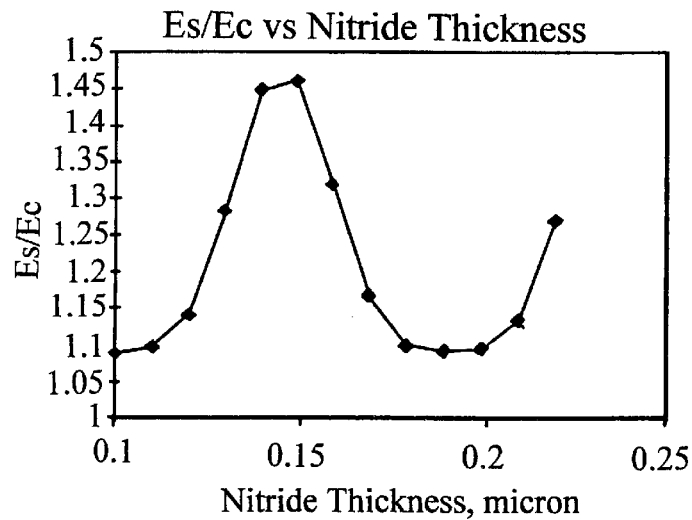
FIG. 6 shows the variation of $E_S/E_C$ with nitride thickness for a resist thickness of 1.05 μm on a nitride substrate.

The variation in the resist profile across a nitride "swing curve" is linked to variations in the $E_S/E_C$ ratio which are large enough to significantly affect process margins. It is clear that a slot 12 in which the resist profile 16, 18 exhibits a "foot" 22 is similar to the slot 12 shown in FIG. 2B, where the resist 8 has only just been cleared to the substrate 6. In such a case, in order to define the feature at the base at its target size, a great deal of further exposure will be required and $E_S/E_C$ will be large. When the resist profile is undercut, the ratio $E_S/E_C$ will be smaller. FIG. 6 shows that the $E_S/E_C$ profile for the nitride swing curve is itself cyclic and can vary from the undercut value of 1.095, as for resist on silicon, to 1.46 for the "footing" profiles.

In practice, nitride thickness will vary depending on the specification of its deposition process, while the resist thickness has to be determined from a wide range of process integration factors. The value of $E_S/E_C$ therefore needs to be added to the process optimization parameters to protect against the risk of resist scumming during development. The resist thickness to be used in conjunction with the target nitride thickness is normally chosen, whenever possible, such that the process operating point is insensitive to nitride thickness changes, at a "swing curve" turning point, which will also be a turning point of the $E_S/E_C$ function. So care must be taken to choose resist thickness at or near the turning point of the nitride "swing curve" which corresponds to minimum reflectivity (maximum incoupling of energy) which is also a maximum of $E_S/E_C$.

In practice small gaps in resist patterns are inspected and measured by electron microscopy but are normally done so "top down" without any benefit of tilt. Therefore, any undercut resist profiles are invisible to the microscope, and the cases with the lowest $E_S/E_C$ are therefore hidden, whereas the "footing" cases which give maximum $E_S/E_C$ will be more readily observed.

The invention is not limited to the use of light at around 365 nm. Other wavelengths may be used, for example 248 nm and 193 nm.

It will be understood that each of the elements described above, or two or more together, also may find a useful application in other types of constructions differing from the types described above.

While the invention has been illustrated and described as embodied in an integrated circuit manufacture, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims:

1. A method of manufacturing integrated circuits, comprising the steps of:
   a) coating a substrate with resist,
   b) exposing the resist to light through a pattern in a mask so as to define apertures in the resist corresponding to the pattern in the mask,
   c) chemically developing the resist after exposure to light, and
   d) choosing a thickness of the resist so as to achieve a desired profile of the apertures defined in the resist, the profile of the apertures being dependent upon the thickness of the resist wherein the thickness of the resist being chosen near a turning point of a substrate swing curve which corresponds to minimum reflectivity during the development process.

2. The method as claimed in claim 1, wherein the thickness of the resist is chosen so as to maximize the ratio between the exposure needed to define a feature at its target size ($E_S$) and the exposure needed to just clear said feature ($E_C$).

3. The method as claimed in claim 2, wherein at least one of the features in the pattern in the mask has a width of 0.5 $\mu$m or less.

4. The method as claimed in claim 1, wherein said light has a wavelength of the order of 365 nm.

5. The method as claimed in claim 1, wherein the resist is a photoactive resist.

6. The method as claimed in claim 1, wherein the substrate is transparent.

7. The method as claimed in claim 1, wherein the substrate is silicon nitride.

8. The method as claimed in claim 1, wherein the substrate is an oxide of silicon.

9. The method as claimed in claim 1, wherein the thickness of said resist is chosen such that a lithography process operating point is insensitive to substrate thickness changes.

* * * * *